US010128147B2

(12) United States Patent
Clevenger et al.

(10) Patent No.: US 10,128,147 B2
(45) Date of Patent: Nov. 13, 2018

(54) INTERCONNECT STRUCTURE

(71) Applicant: International Business Machines Corporation, Armonk, NY (US)

(72) Inventors: Lawrence A. Clevenger, Rhinebeck, NY (US); Roger A. Quon, Rhinebeck, NY (US); Terry A. Spooner, Clifton Park, NY (US); Wei Wang, Schenectady, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/878,546

(22) Filed: Jan. 24, 2018

(65) Prior Publication Data

US 2018/0151420 A1    May 31, 2018

Related U.S. Application Data

(62) Division of application No. 15/251,403, filed on Aug. 30, 2016, now Pat. No. 9,953,864.

(51) Int. Cl.
*H01L 21/4763*     (2006.01)
*H01L 21/768*      (2006.01)
(Continued)

(52) U.S. Cl.
CPC .... *H01L 21/76825* (2013.01); *H01L 21/7684* (2013.01); *H01L 21/76807* (2013.01);
(Continued)

(58) Field of Classification Search
None
See application file for complete search history.

(56) References Cited

U.S. PATENT DOCUMENTS 5,821,168 A * 10/1998 Jain .................. H01L 21/76807
                                                          438/692
6,040,243 A *  3/2000 Li .................... H01L 21/76805
                                                          257/E21.579

(Continued)

OTHER PUBLICATIONS

Lawrence A. Clevenger, et al., Pending U.S. Appl. No. 15/251,403 entitled "Interconnect Structure," filed with the U.S. Patent and Trademark Office on Aug. 30, 2016.

(Continued)

*Primary Examiner* — Hung Vu
(74) *Attorney, Agent, or Firm* — Cantor Colburn LLP; Vazken Alexanian

(57) ABSTRACT

Semiconductor structures include a patterned interlayer dielectric overlaying a semiconductor substrate. The interlayer dielectric includes a first dielectric layer and at least one additional dielectric layer disposed on the first dielectric layer, wherein the patterned interlayer dielectric comprises at least one opening extending through the interlayer dielectric to the semiconductor substrate. Chemically enriched regions including ions of Si, P, B, N, O and combinations thereof are disposed in surfaces of the first dielectric layer and the at least one dielectric layer defined by the at least one opening. Also described are methods of for forming an interconnect structure in a semiconductor structure.

17 Claims, 6 Drawing Sheets

(51) Int. Cl.
*H01L 23/532* (2006.01)
*H01L 23/522* (2006.01)

(52) U.S. Cl.
CPC .. *H01L 21/76814* (2013.01); *H01L 21/76843* (2013.01); *H01L 21/76879* (2013.01); *H01L 23/5226* (2013.01); *H01L 23/53238* (2013.01); *H01L 23/53295* (2013.01)

(56) References Cited

U.S. PATENT DOCUMENTS

| | | | | |
|---|---|---|---|---|
| 6,249,055 B1* | 6/2001 | Dubin | ............... | H01L 21/76831 257/751 |
| 2007/0123043 A1* | 5/2007 | Streck | ............... | H01L 21/76802 438/687 |
| 2008/0286966 A1* | 11/2008 | Hohage | ............. | H01L 21/02074 438/653 |

OTHER PUBLICATIONS

List of IBM Patents or Patent Applications Treated as Related; (Appendix P), Date Filed Jan. 24, 2018; 2 pages.

* cited by examiner

INTERCONNECT STRUCTURE

DOMESTIC PRIORITY

This Application is a DIVISIONAL of U.S. patent application Ser. No. 15/251,403, filed Aug. 30, 2016, which is incorporated by reference herein in its entirety.

BACKGROUND

The present invention generally relates to semiconductor integrated circuits, and more particularly, to the structure and formation of interconnect structures.

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called vias or contact holes) and trenches therein allow electrical contact to be made selectively to underlying device regions. A conducting material such as copper is used to fill these holes, which then make contact to semiconductor devices.

The openings are typically lined with a liner material, i.e., a barrier layer, to prevent migration of the conducting material into the dielectric material, which can lead to electrical short circuits, rendering the circuit unusable.

SUMMARY

The invention is generally directed to semiconductor structures and methods for forming an interconnect structure in semiconductor structures.

In one or more embodiments, a method for forming an interconnect structure in a semiconductor structure includes first forming at least one opening extending through an interlayer dielectric, wherein the interlayer dielectric includes a first dielectric layer and at least one additional dielectric layer disposed on the first dielectric layer. The first dielectric layer is formed of a different material than the at least one additional dielectric layer. The surfaces defining the at least one opening are then treated to form a chemically enriched dielectric region in the surfaces, wherein the chemically enriched dielectric region includes ions such as Si, P, N, B, O or combinations including two or more of the ions. A percentage of the ions in the chemically enriched dielectric region of the first dielectric layer is different from a percentage of the ions in the chemically enriched dielectric region of the at least one additional dielectric layer.

In one or more embodiments, a semiconductor structure includes a patterned interlayer dielectric overlaying a semiconductor substrate, wherein the interlayer dielectric includes a first dielectric layer and at least one additional dielectric layer disposed on the first dielectric layer. The patterned interlayer dielectric includes at least one opening extending through the interlayer dielectric to the semiconductor substrate. The semiconductor structure further includes chemically enriched regions comprising ions of Si, P, B, N, O and combinations thereof in a surface of the first dielectric layer and the at least one dielectric layer defined by the at least one opening.

In one or more other embodiments, a semiconductor structure includes a patterned interlayer dielectric overlaying a semiconductor substrate, wherein the interlayer dielectric includes a first dielectric layer and at least one additional dielectric layer disposed on the first dielectric layer. The patterned interlayer dielectric comprises at least one opening extending through the interlayer dielectric to the semiconductor substrate. The semiconductor structure further includes chemically enriched regions including nitrogen ions in a surface of the first dielectric layer and the at least one dielectric layer defined by the at least one opening. A percentage of the nitrogen ions in the chemically enriched dielectric region of first dielectric layer is different from a percentage of the ions in the chemically enriched dielectric region of the at least one additional dielectric layer. The semiconductor structure further includes a barrier layer disposed on the surfaces defined by the at least one opening and a conductive metal filling the at least one opening.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally provides copper interconnect structures and processes for forming the copper interconnect structures. The structures and processes generally include a pre-liner dielectric modification treatment of the interlayer dielectric surface in which the interconnect structure is formed followed by liner deposition. As will be discussed in greater detail below, the pre-liner dielectric modification treatment provides the interlayer dielectric surface with varying ionic amounts of Si, N, P, B, O or combinations thereof in the dielectric surfaces to form modified regions chemically enriched with the particular element. In one or more embodiments, the interlayer dielectric can be formed of two or more layers of dielectric materials, wherein at least two of the layers are of different dielectric materials and the surfaces thereof can include different percentage amounts of the chemically enriched element in the dielectric surface of the interconnect structure after the pre-liner modification treatment.

In one or more embodiments, the structures and processes generally include formation of a tantalum liner layer in place of a TaN/Co liner layer prior to deposition of the copper metal to further reduce line and via resistances. Advantageously, the presence of the tantalum deposited on the modified chemically enriched surface results in formation of an effective barrier composed of tantalum and the element upon annealing, e.g., Ta(N) in the case of nitrogen enrichment, which also provides effective electromigration resistance for the subsequently deposited conductive metal.

Figure 1:
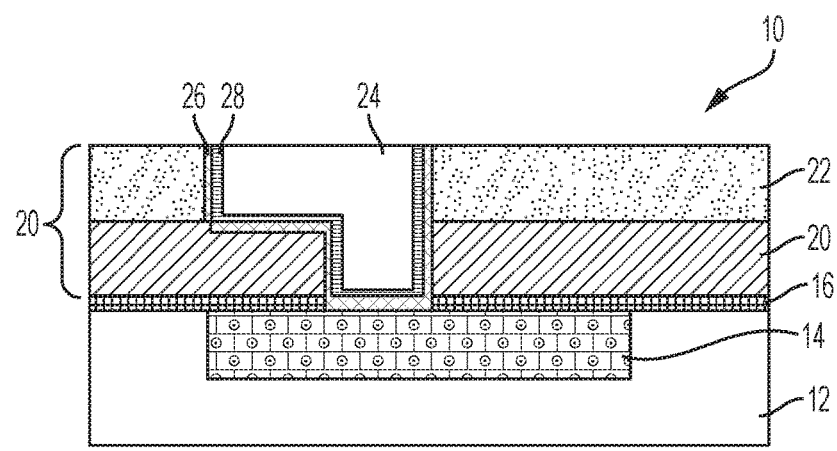
FIG. 1 depicts a schematic cross-sectional view illustrating a semiconductor structure including an interconnect structure in accordance with one or more embodiments.

FIG. 1 illustrates a cross-sectional view of an exemplary semiconductor device 10 including an interconnect structure that includes a modified dielectric surface in accordance with the present invention. The semiconductor device 10 generally includes a dielectric layer 12, a metal conductor 14 formed in the dielectric layer 12, a planar capping layer 16 disposed thereon, an interlayer dielectric layer 18 deposited onto the capping layer 16 including a first dielectric layer 20 and at least one additional dielectric layer 22, wherein via and trench features defining the interconnect structure can be formed therein.

The first and the at least one additional dielectric materials 20, 22 defining the interlayer 18 are different materials and the dielectric surfaces of the first and the at least one additional dielectric materials 20, 22 defining the via and trench features have a modified chemically enriched surface 26 with different percentages of the chemically enriched element relative to one another.

For ease of understanding, reference herein will now be made to nitrogen enriched regions formed by a nitridation pre-treatment. However, it should be apparent that other elements such as Si, P, B, O or combination thereof including with N can be utilized to form the chemically enriched dielectric surfaces. By way of example, the first dielectric layer 20 can be a silsequioxane and have a percentage of nitrogen from 0.5 to about 1.5 percent whereas the at least one additional dielectric layer 22 can be silicon dioxide and have a percentage of nitrogen greater than 2 percent at/in the surface. The number of dielectric layers that define the interlayer 18 is not intended to be limited provided that at least two of the dielectric layers are formed from different materials and the interconnect structure is formed in the interlayer 18.

The exemplary semiconductor structure 10 further includes a metal liner layer 28. As will be discussed in greater detail below, the process of fabricating the interconnect structure generally includes an annealing step, wherein the metal liner can react with the nitrogen in the dielectric surface to provide an effective metal nitride liner layer and prevent electromigration of the copper.

Copper metal 24 fills the via and trench feature to form the interconnect structure. In one or more embodiments, the bottom of the via is free of nitrogen and metal liner 28, which can be provided by cleaning the bottom surface prior to deposition of a seed layer or the like for copper metal fill of the trench and via features.

Figure 2:
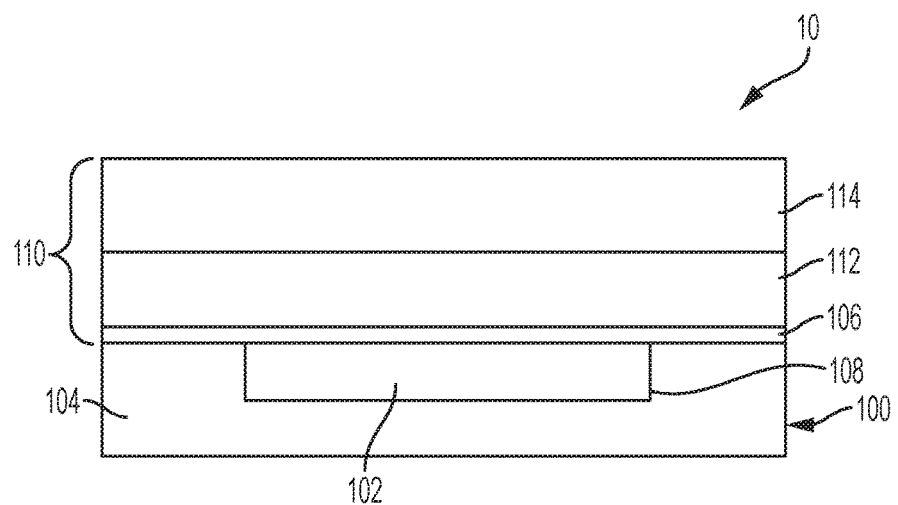
FIG. 2 depicts a schematic cross-sectional view illustrating a semiconductor structure after formation of a point defect region in the interlayer dielectric.

Referring now to FIGS. 2-6, there is shown a process for forming a semiconductor structure including an interconnect structure. As shown in FIG. 2, the process generally begins with formation of an interlayer 110 onto a substrate 100, wherein formation of the interlayer 110 includes deposition of least two different dielectric layers 112, 114. The substrate 100 can include a metal conductive line 102 for which interconnection with the interconnect structure is made. The metal conductive line 102 is disposed within dielectric layer 104 and includes a capping layer 106 thereon. In one or more embodiments, the metal conductive line 102 can include a liner layer 108 to prevent metal diffusion into the dielectric layer 104.

The metal conductive line 102 can be any conductive metal including but not limited to copper, aluminum, tungsten, cobalt, ruthenium, iridium, rhodium, mixtures thereof and the like.

The dielectric layer 104 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by PECVD, spin-on or other procedures as is generally known in the art.

The capping layer 106 protects the underlying metal conductive line 102 from oxidation, humidity, and contamination during formation of the interconnect structure and the next metal level(s) on the semiconductor wafer 10. Additionally, capping layer 106 serves to prevent undesirable diffusion of the underlying conductor 14 into interlayer 110. Capping layer 16 can be made of any suitable capping material such as silicon nitride, silicon carbide, silicon oxycarbide, hydrogenated silicon carbide, silicon dioxide, organosilicate glass, and other low-k dielectrics.

The interlayer 110 and the at least two dielectric layers 112, 114 that make up the interlayer 110 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by PECVD, spin-on or other procedures as is generally known in the art.

By way of example, dielectric layer 112 can be a dielectric material selected from the group consisting of silsequioxanes, carbon doped oxides that include atoms of Si, C, O, and H, SiCOH, SiLK, and the like. Dielectric layer 114 can be silicon dioxide, tetraorthosilicate (TEOS), or the like. The thicknesses of each layer are not intended to be limited and can be of equal thicknesses or unequal thicknesses.

Figure 3A:
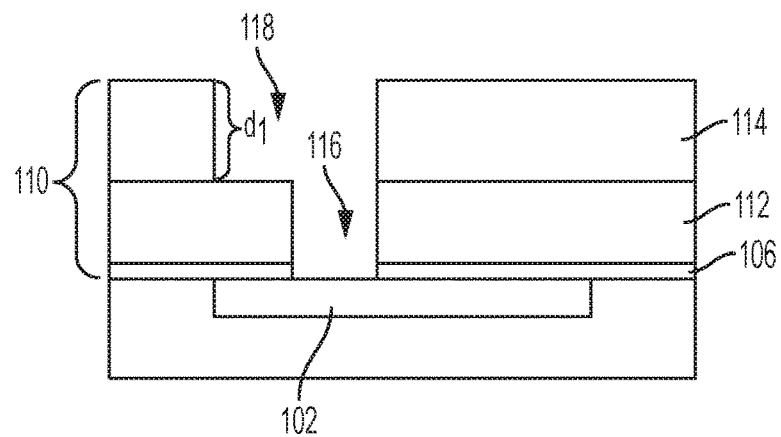
FIG. 3A depicts a schematic cross-sectional view illustrating the semiconductor structure of FIG. 2 after patterning the interlayer dielectric according to one or more embodiments.
Figure 3B:
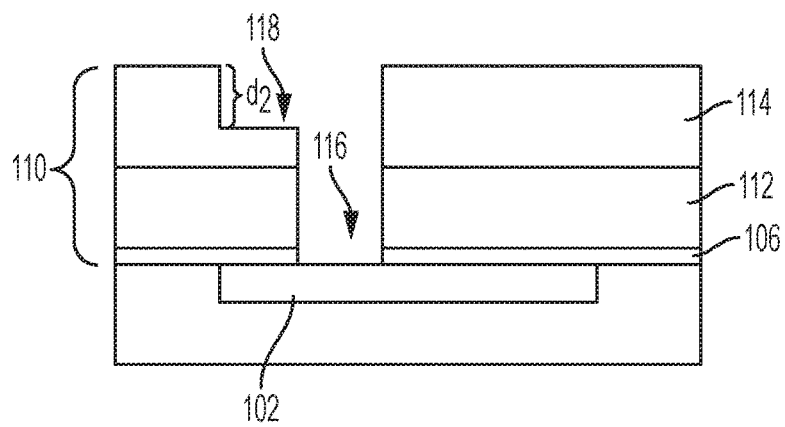
FIG. 3B depicts a schematic cross-sectional view illustrating the semiconductor structure of FIG. 2 after patterning the interlayer dielectric according to one or more embodiments.
Figure 3C:
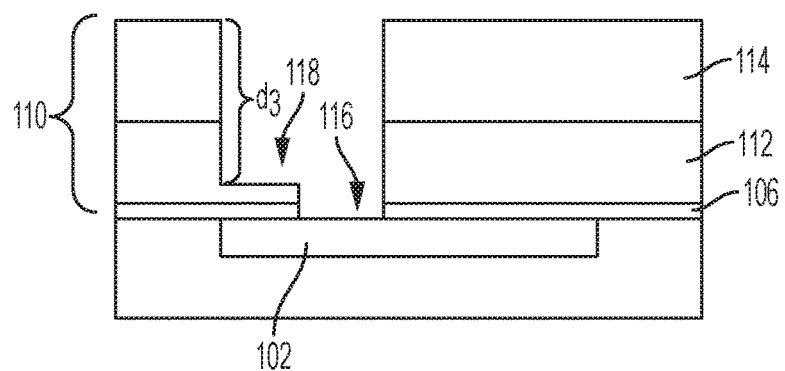
FIG. 3C depicts a schematic cross-sectional view illustrating the semiconductor structure of FIG. 2 after patterning the interlayer dielectric according to one or more embodiments.

As shown in FIGS. 3A-3C, the process includes patterning the interlayer 110, which can include a dual damascene process to create via and trench features 116, 118, respectively. The dual damascene process generally includes first forming vias in the interlayer 110 followed by trench formation using standard lithography and etching techniques. The lithographic step generally includes applying a photoresist to the surface of the dielectric layer, exposing the photoresist to a desired pattern of radiation, and developing the exposed resist utilizing a photoresist developer to form a pattern. The etching process can be a dry etching or wet etching process.

The term "wet etching" generally refers to application of a chemical solution. This is preferably a time controlled dip in the etch solution. Preferred etch solutions include $HNO_3$, HCL, $H_2SO_4$, HF or combinations thereof. The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes.

In the dual damascene process, the capping layer 106 at the bottom of the via 116 is also selectively removed, thereby exposing the metal conductive line 102.

In one or more embodiments, the via feature 116 can be formed in dielectric layer 112 and a trench 118 is formed in dielectric layer 114 as shown in FIG. 3A. As shown, the depth (d1) of the trench 118 can be at about equal to a thickness of the dielectric layer 112.

In one or more other embodiments, the trench feature 118 is formed in a portion of the dielectric layer 114, i.e., the depth (d2) of the trench is less than the thickness of dielectric layer 114 as shown in FIG. 3B.

In one or more other embodiments, the trench feature 118 is formed in dielectric layer 114 and a portion extends to dielectric layer 112 114 such that the trench feature has a depth (d3) greater than a thickness of the dielectric layer 114 as shown in FIG. 3C.

In one or more other embodiments, the via 116 is formed in a portion of the dielectric layer 112, i.e., the height of the via is less than the thickness of dielectric layer 112, and the trench feature formed in both dielectric layers 112, 114 as shown in FIG. 3C. As shown, the trench feature has a height dimension greater than the thickness of dielectric layer 114.

Figure 4A:
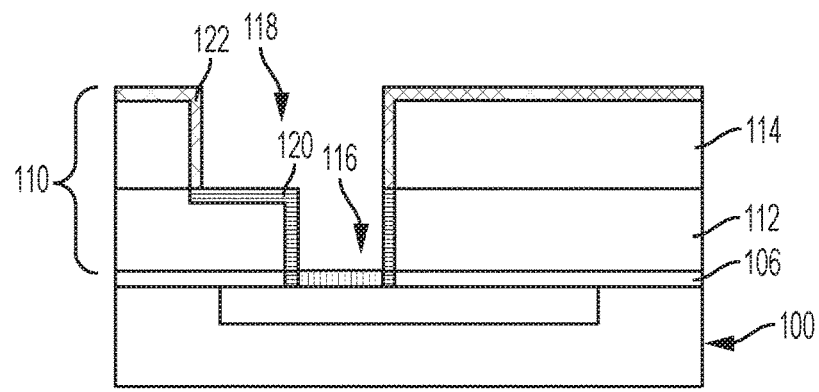
FIG. 4A depicts a schematic cross-sectional view illustrating the semiconductor structure after nitridation of the patterned interlayer dielectric of FIG. 3A.
Figure 4B:
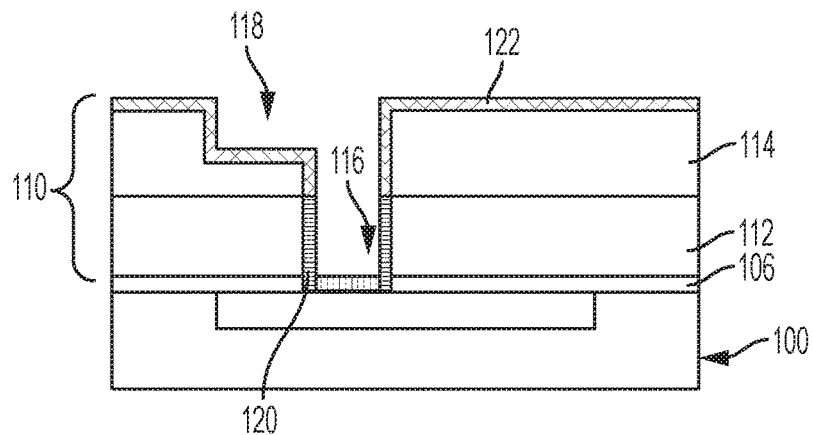
FIG. 4B depicts a schematic cross-sectional view illustrating the semiconductor structure after nitridation of the patterned interlayer dielectric of FIG. 3B.
Figure 4C:
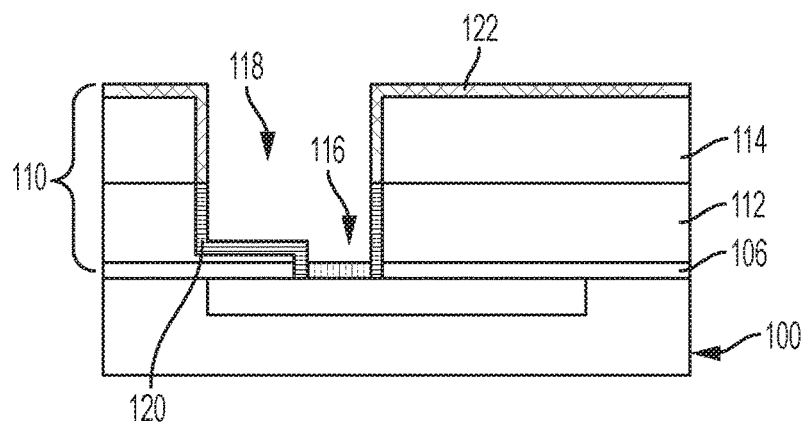
FIG. 4C depicts a schematic cross-sectional view illustrating the semiconductor structure after nitridation of the patterned interlayer dielectric of FIG. 3C.

Referring now to FIGS. 4A-4C, the surfaces of the via and trench features, 116, 118, respectively, formed in interlayer 110 as shown in the previous Figures are subjected to selective nitridation. In this step, the exposed surfaces of the patterned interlayer 110 including the surfaces defining the trench and via features 116, 118, respectively, are exposed to nitrogen ions generated from a nitrogen-containing gas to form a nitrogen enriched region on/in the respective dielectric layer surface. The generation of the nitrogen ions can be plasma or thermally generated, wherein the nitrogen ions penetrate into at least a portion of the dielectric layer surface. As noted above, the selective nitridation process is configured to provide each dielectric layer 112, 114 with different percentages of nitrogen ions relative to the other dielectric layer, which is formed of a different material. That is, dielectric layer 112 includes nitrogen ion region 120 and dielectric layer 114 includes nitrogen region 120, wherein the percentage of nitrogen ions in the respective nitrogen ion regions 120, 122 is different and generally confined to the specific dielectric layer 112, 114.

The penetration of the nitrogen ions into the dielectric surface is generally on the order of a few Angstroms. In one or more embodiments, the penetration of the nitrogen ions into the dielectric surface is less than 10 Angstroms. In one or more other embodiments, the penetration of the nitrogen ions into the dielectric surface is less than 5 Angstroms and in still one or more other embodiments, the penetration of the nitrogen ions into the dielectric surface is greater than 1 Angstrom to less than 3 Angstroms.

In one or more embodiments, the percentage of nitrogen ions in dielectric layer 112 is less than the percentage of nitrogen ions in dielectric layer 114, which can provide greater adhesion of the subsequently deposited liner layer as well as prevent metal diffusion. In one or more embodiments, the percentage of nitrogen ions in dielectric layer 112 is greater than the percentage of nitrogen ions in dielectric layer 114. In one or more embodiments, the percentage of nitrogen ions in dielectric layer 112 is 0.5 to 1.5% and the percentage of nitrogen ions in dielectric layer 114 is greater than 2%. By way of example, one of the dielectric layers 112 or 114 is selected from the group consisting of silicon dioxide and TEOS. The other dielectric layer is selected from the group of silsequioxanes, carbon doped oxides such as organosilicates that include atoms of Si, C, O and H. Each dielectric layer is subjected to the nitridation process to provide different percentages of nitrogen into the respective dielectric surface.

As defined herein, the nitrogen-containing gas for the nitridation process is not intended to be limited and can be selected from the group consisting of nitrogen ($N_2$) and ammonia ($NH_3$). Upon exposure to a suitable energy source, the nitrogen or ammonia dissociates to form nitrogen ions, which are then utilized to enrich a contact surface such as the exposed surfaces of the dielectric layer with nitrogen ions. Suitable energy sources include, but are not limited to, plasma energy sources and thermal energy sources.

Plasma nitridation generally includes exposing the nitrogen-containing gas to a plasma energy source effective to generate the nitrogen ions from the nitrogen containing gas. The substrate including the exposed dielectric layer surfaces of the trench and via are then exposed to the nitrogen ions to form a nitrogen enriched surface that also penetrates the respective surface to form a nitrogen enriched gradient in the dielectric layer. The process temperature is between 80 and 400° C., and the bias is typically between 100 and 900 W. By way of example, the plasma nitridation step can include exposing a process gas including N atoms to an ionizing plasma at an ion current density of about 100 to about 5000 μA/cm² in one or more embodiments, and about 500 to about 2000 μA/cm² in one or more other embodiments.

Thermal nitridation provides a similar effect as plasma nitridation but generally includes exposing the substrate to a temperature effective to generate nitrogen ions from the nitrogen containing gas. Again, the nitrogen ions contact and penetrate the exposed surface of the dielectric layer so as to form a nitrogen enriched gradient in the dielectric layer. The process temperature is generally between 200 to 400° C.

Figure 5A:
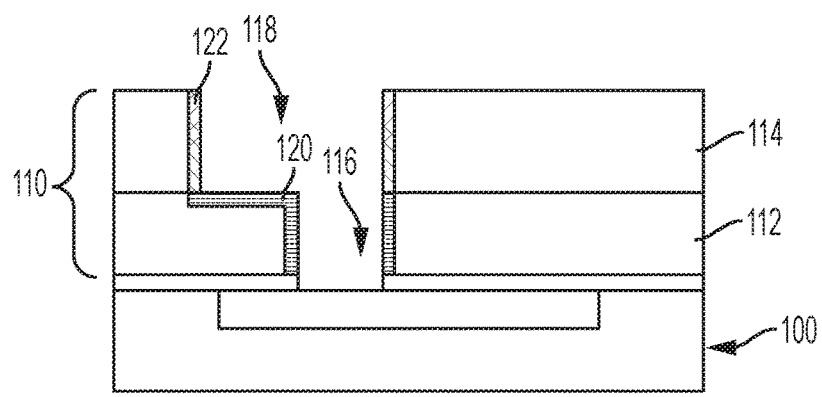
FIG. 5A depicts a schematic cross-sectional view illustrating the semiconductor structure subsequent to cleaning of a via bottom in the patterned interlayer dielectric of FIG. 4A.
Figure 5B:
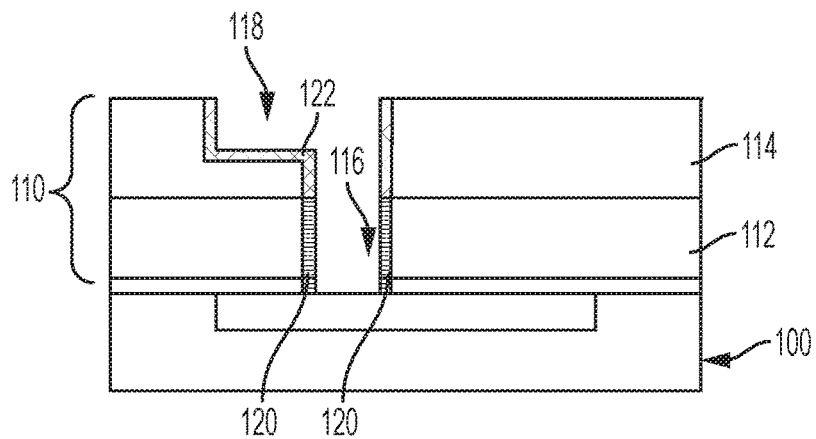
FIG. 5B depicts a schematic cross-sectional view illustrating the semiconductor structure subsequent to cleaning of a via bottom in the patterned interlayer dielectric of FIG. 4B.
Figure 5C:
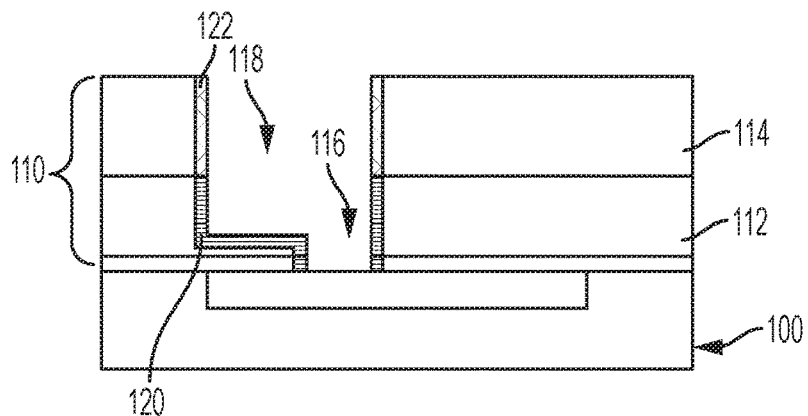
FIG. 5C depicts a schematic cross-sectional view illustrating the semiconductor structure subsequent to cleaning of a via bottom in the patterned interlayer dielectric of FIG. 4C.

As shown in FIGS. 5A-5C, a plasma treatment is then performed to clean the exposed the surface of the metal conductive line at the bottom of the via of contaminants, oxides, nitrides, or the like. The plasma or thermal nitridation noted above and the cleaning step can be repeated multiple times as desired.

The plasma cleaning step can include exposing a process gas including $H_2$, He, forming gas, $O_2$ or combinations thereof and a carrier gas. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an ion current density generally less than 50 μA/cm², and a process time of between about 5 seconds and about 600 seconds. In one or more embodiments, the ion current density is about 5 to about 20 μA/cm².

Figure 6A:
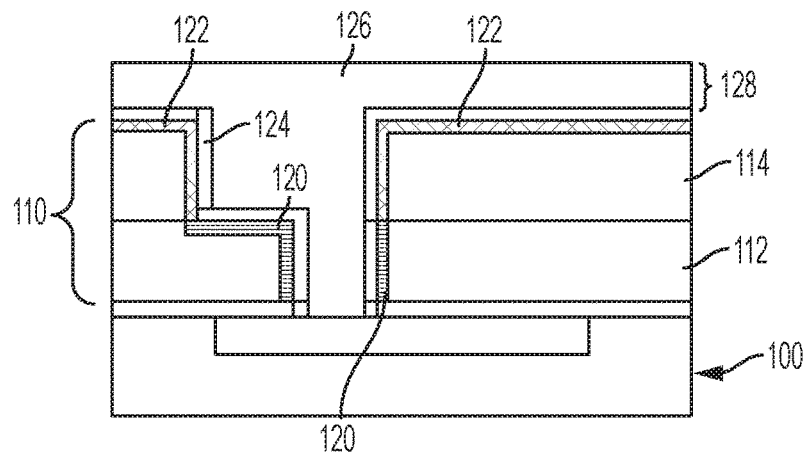
FIG. 6A depicts a schematic cross-sectional view illustrating the semiconductor structure subsequent to metal liner deposition and copper metallization of the patterned interlayer dielectric of FIG. 5A.
Figure 6B:
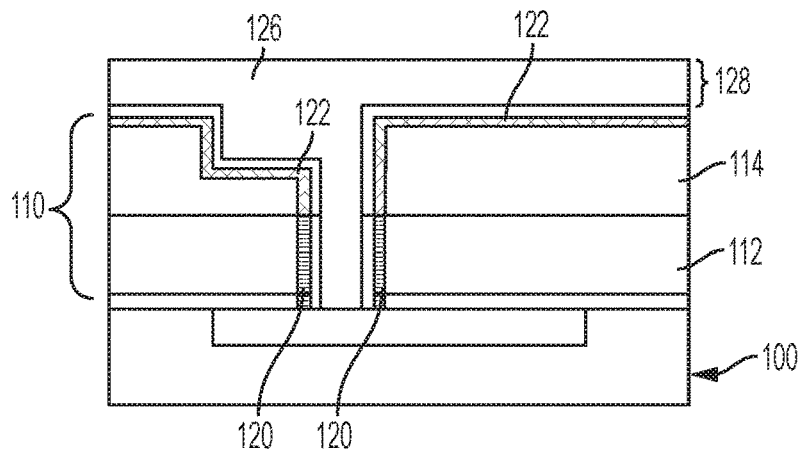
FIG. 6B depicts a schematic cross-sectional view illustrating the semiconductor structure to metal liner deposition and copper metallization of the patterned interlayer dielectric of FIG. 5B.
Figure 6C:
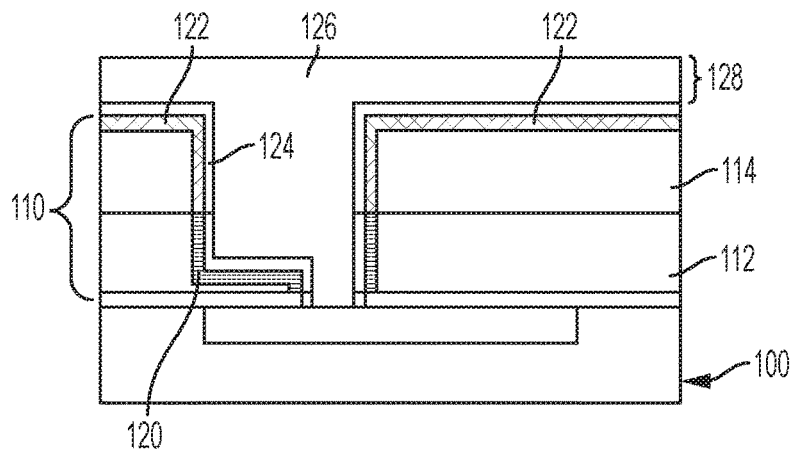
FIG. 6C depicts a schematic cross-sectional view illustrating the semiconductor structure to metal liner deposition and copper metallization of the patterned interlayer dielectric of FIG. 5C.

IN FIGS. 6A-6C, metallization is completed by conformal deposition of a metal liner layer 124 onto the substrate followed by copper filling 126 and chemical mechanical planarization so as to form the semiconductor structure previously shown in FIG. 1.

The metal liner layer 124 can be deposited onto the nitrogen exposed second dielectric surfaces 112, 114 by a conformal deposition process such as, for example, atomic layer deposition (ALD), chemical vapor deposition (CVD), plasma enhanced chemical vapor deposition (PECVD), sputtering, chemical solution deposition, or plating. The thickness of metal liner layer generally ranges from 0.5 Angstroms to 250 Angstroms. The resulting metal liner layer 124 serves as a barrier to prevent the subsequently deposited copper conductive interconnect material from diffusing through to the dielectric layers 112, 114 and is formed by reaction between the metal and the nitrogen regions 120, 122 in the dielectric surfaces, 112, 114, respectively, after an annealing step, which can occur subsequent to copper filling.

In one or more embodiments, then metal liner layer includes deposition of tantalum, which forms tantalum nitride upon annealing. Other suitable metals for forming metal liner include, but are not limited to, Ru, Co, Cu, nitrides thereof, or alloys thereof.

The metal lined via and trench features are then filled with a conductive metal 126 such as copper to form the interconnect structure as shown in FIGS. 6A-C. Filling the pattern with a copper metal can include first depositing a copper seed layer. The copper seed layer can be also deposited by sputtering. The seed layer would typically be about 50 to 400 Å thick. The function of the seed layer is to provide a base onto which a main conductor layer can be deposited. The seed layer can be deposited by atomic layer deposition (ALD), sputter deposition, plasma vapor deposition (PVD), chemical vapor deposition (CVD) or the like.

Suitable seed layers are generally chosen to provide improved electromigration resistance, improved adhesion to the underlying liner layer, and improved surface properties suitable for deposition of the main conductor copper body. Exemplary copper alloys that have been shown to improve the electromigration resistance relative to pure copper, include Cu (Sn), Cu (In), Cu (zr), Cu (Ti) and Cu (C, N, O, Cl, S). Exemplary seed layers that improve the adhesion properties relative to pure copper which include Cu (Al), Cu (Mg), and alloys of Cu with other reactive metals such as Be, Ca, Sr, Ba, Sc, Y, La, and rare earth series elements of Ce, Pr, Nd, Sm, Eu, Gd, Tb, Dy, Ho, Er, Tm, Yb and Lu, and Hf, V, Mb, Ta, Cr, Mo, W, Mn, Re, Si and Ge. The seed layer can include additional alloying elements that improve surface properties for the seed layer such as B, O, N, P, Fe, Ru, Os, Co, Rh, Ir, Ni, Pd, Pt, Ag, Au, Zn and Cd. Uniformity of seed layer is typically desired, because a poor seed layer can result in voids. It is also desirable to ensure that the seed layer surface is free of oxides for efficient charge transfer during plating.

On top of seed layer, a conductive metal layer 126 (e.g., a copper conductor) is deposited. The conductive metal layer 126 can be deposited onto the surface by an electrochemical deposition process. Other processes such as e-beam evaporative deposition, physical vapor deposition, or CVD, can be used to deposit the metal layer. The conductive metal fills the via and trench features 116, 118. In addition, a metal layer 128 is formed over the top surfaces of the dielectric layer, which is also referred to as the overburden. Exemplary conductive metals suitable for the interconnect structure includes low resistivity materials such as copper, aluminum, tungsten, cobalt, ruthenium, iridium, rhodium, mixtures thereof and the like.

In one or more embodiments, the substrate is then subjected to an annealing process, which improves various properties of the metal conductor such as providing an increased grain size so as to increase conductivity, reducing stress, and reducing electromigration. The annealing process generally includes heating the substrate at an elevated temperature typically less than 400° C. in an inert atmosphere for a defined period of time of about sixty minutes or less. Ovens, furnaces, rapid thermal processing equipment and the like can be utilized for the annealing process.

After annealing, a chemical mechanical polishing (CMP) process is then utilized to remove the overburden and portions of the liner layer 124 formed at the top surface of the dielectric layer 114, i.e., removes material from the field area. The CMP process planarizes the surface of the interconnect structure by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry. The trench feature in the resulting interconnect structure includes a liner layer formed within the dielectric layer, the seed layer, and the metal conductor. Optionally, the CMP process can occur prior to the annealing process.

Figure 7:
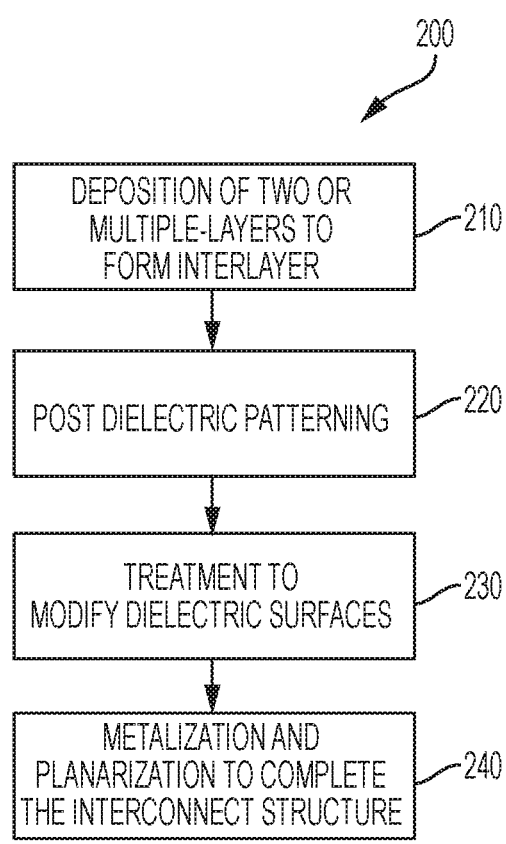
FIG. 7 depicts a process flow for forming a semiconductor structure including an interconnect structure in accordance with one or more embodiments.

FIG. 7 provides an overview of the process 200 for forming the semiconductor structure as described herein. The process generally includes a first step 210 including deposition of two or more layers for a dielectric material to form an interlayer dielectric, wherein at least two of the dielectric materials are of different materials. The interlayer dielectric layer is then patterned such as with a dual damascene process to form via and trench features as shown in step 220. Next, the substrate including the patterned interlayer is subjected to a nitridation treatment to modify the dielectric surfaces as shown in step 230. The nitridation treatment generates nitrogen ions that penetrate into the different dielectric materials to provide different percentages of nitrogen ions. In step 240, metallization and planarization is provided to complete the interconnect structure such as the interconnect structure shown in FIG. 1.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A method for forming an interconnect structure in a semiconductor structure, comprising:
    forming at least one opening extending through an interlayer dielectric, wherein the interlayer dielectric comprises a first dielectric layer and at least one additional dielectric layer disposed on the first dielectric layer, wherein the first dielectric layer is formed of a different material than the at least one additional dielectric layer; and
    treating surfaces defining the at least one opening to form a chemically enriched dielectric region in the surfaces, wherein the chemically enriched dielectric region comprises ions comprising Si, P, N, B, O or combinations including two or more of the ions, and wherein a percentage of the ions in the chemically enriched dielectric region of first dielectric layer is different from a percentage of the ions in the chemically enriched dielectric region of the at least one additional dielectric layer.

2. The method of claim 1, wherein the chemically enriched dielectric region comprises nitrogen ions and the percentage of nitrogen ions in the first dielectric layer is greater than the percentage of nitrogen ions in the at least one additional dielectric layer.

3. The method of claim 1, wherein the chemically enriched dielectric region comprises nitrogen ions and the percentage of nitrogen ions in the first dielectric layer is less than the percentage of nitrogen ions in the at least one additional dielectric layer.

4. The method of claim 1, wherein the chemically enriched dielectric region comprises nitrogen ions, wherein the first dielectric layer has the percentage of nitrogen greater than 0.5 percent to 1.5 percent and the at least one additional material dielectric layer has the percentage of nitrogen greater than 2 percent.

5. The method of claim 4, wherein the first dielectric comprises silicon dioxide or tetraorthosilicate, and the second dielectric layer comprises a silsesquioxane or a carbon doped oxide including atoms of Si, C, O and H.

6. The method of claim 1, further comprising cleaning a bottom surface of the at least one opening.

7. The method of claim 6, further comprising conformally depositing a metal liner layer comprising tantalum in the at least one opening subsequent to the cleaning; filling the at least one opening with a conductive metal; and chemically mechanically polishing to a top surface of the interlayer.

8. The method of claim 1, wherein treating the surfaces defining the at least one opening to form the chemically enriched region in the interlayer dielectric comprises exposing a process gas to plasma to generate the ions.

9. A pre-liner dielectric modification treatment method for forming an interconnect structure in a semiconductor structure, comprising:
    depositing two or more dielectric layers to define an interlayer dielectric, wherein at least two of the dielectric layers are formed of different dielectric materials;
    patterning the interlayer dielectric to form at least one opening exposing surfaces of the different dielectric materials;
    exposing the surfaces of the different dielectric materials to ions comprising Si, P, N, B, O or combinations including two or more of the ions, wherein percentages of the ions that penetrate into the different dielectric materials are different.

10. The method of claim 9, wherein the at least two of the dielectric layers formed of different dielectric materials comprise a first dielectric layer overlaying a second dielectric layer, and wherein the ions comprise nitrogen ions and the percentage of nitrogen ions in the first dielectric layer is greater than the percentage of nitrogen ions in the at least one additional dielectric layer.

11. The method of claim 10, wherein the first dielectric comprises silicon dioxide or tetraorthosilicate, and the second dielectric layer comprises a silsesquioxane or a carbon doped oxide including atoms of Si, C, O and H.

12. The method of claim 9, wherein the at least two of the dielectric layers formed of different dielectric materials comprise a first dielectric layer overlaying a second dielectric layer, and wherein the ions comprise nitrogen ions and the percentage of nitrogen ions in the first dielectric layer is less than the percentage of nitrogen ions in the at least one additional dielectric layer.

13. The method of claim 12, wherein the first dielectric comprises silicon dioxide or tetraorthosilicate, and the second dielectric layer comprises a silsesquioxane or a carbon doped oxide including atoms of Si, C, O and H.

14. The method of claim 9, wherein the at least two of the dielectric layers formed of different dielectric materials comprise a first dielectric layer overlaying a second dielectric layer, wherein the ions comprise nitrogen ions, and wherein the first dielectric layer has the percentage of nitrogen greater than 0.5 percent to 1.5 percent and the at least one additional material dielectric layer has the percentage of nitrogen greater than 2 percent.

15. The method of claim 9, further comprising cleaning a bottom surface of the at least one opening.

16. The method of claim 15, further comprising conformally depositing a metal liner layer comprising tantalum in the at least one opening subsequent to the cleaning; filling the at least one opening with a conductive metal; and chemically mechanically polishing to a top surface of the interlayer.

17. The method of claim 9, wherein exposing the surfaces of the different dielectric materials to the ions comprises exposing a process gas to plasma to generate the ions.

\* \* \* \* \*